United States Patent
Zybura et al.

(10) Patent No.: US 11,233,485 B2
(45) Date of Patent: Jan. 25, 2022

(54) POWER AMPLIFIER LINEARIZATION CIRCUIT AND RELATED APPARATUS

(71) Applicant: Qorvo US, Inc., Greensboro, NC (US)

(72) Inventors: Michael F. Zybura, Scotts Valley, CA (US); Toshiaki Moriuchi, San Jose, CA (US); Baker Scott, San Jose, CA (US); Mikyung Cho, Sunnyvale, CA (US); Edward T. Spears, Stokesdale, NC (US)

(73) Assignee: Qorvo US, Inc., Greensboro, NC (US)

( * ) Notice: Subject to any disclaimer, the term of this patent is extended or adjusted under 35 U.S.C. 154(b) by 30 days.

(21) Appl. No.: 16/816,430

(22) Filed: Mar. 12, 2020

(65) Prior Publication Data
US 2021/0288617 A1 Sep. 16, 2021

(51) Int. Cl.
*H03F 1/32* (2006.01)
*H03F 3/21* (2006.01)

(52) U.S. Cl.
CPC .......... *H03F 1/3241* (2013.01); *H03F 3/21* (2013.01); *H03F 2200/451* (2013.01); *H03F 2201/3231* (2013.01)

(58) Field of Classification Search
CPC .................................................. H03F 1/3241
USPC .......................................... 330/149; 375/297
See application file for complete search history.

(56) References Cited

U.S. PATENT DOCUMENTS

| | | | |
|---|---|---|---|
| 7,248,112 B2 * | 7/2007 | Itahara | H03F 1/3223 330/149 |
| 9,998,200 B2 * | 6/2018 | Kennard | H04B 7/15535 |
| 2004/0232985 A1 * | 11/2004 | Itahara | H03F 1/3223 330/149 |
| 2008/0197925 A1 * | 8/2008 | Furuta | H04B 1/0475 330/149 |
| 2013/0044836 A1 * | 2/2013 | Koren | H03F 1/3247 375/297 |

(Continued)

OTHER PUBLICATIONS

Ali, Sheikh Nijam., et al., "Transformer-based predistortion linearizer for high linearity and high modulation efficiency in mm-wave 5G CMOS power amplifiers," IEEE Transactions on Microwave Theory and Techniques, vol. 67, No. 7, Jul. 2019, pp. 3074-3087.

(Continued)

*Primary Examiner* — Henry Choe
(74) *Attorney, Agent, or Firm* — Withrow & Terranova, P.L.L.C.

(57) ABSTRACT

A power amplifier linearization circuit and related apparatus is provided. In examples disclosed herein, the power amplifier linearization circuit includes an analog pre-distortion (APD) circuit coupled to an input of a power amplifier. Notably, the power amplifier can exhibit linearity response deviation, namely linearity amplitude response deviation and linearity phase response deviation, when amplifying a radio frequency (RF) signal under a compression condition. As such, the APD circuit is configured to receive a control signal corresponding to the linearity response deviation and pre-process the RF signal based on the control signal before providing the RF signal to the power amplifier. As a result, it may be possible to reduce the linearity response deviation in the power amplifier, thus helping to improve linearity and RF performance of the power amplifier.

20 Claims, 10 Drawing Sheets

(56) References Cited

U.S. PATENT DOCUMENTS

2013/0113559 A1* 5/2013 Koren .................. H03F 1/0266
330/149

OTHER PUBLICATIONS

Ando, Akihiro, et al. "A predistortion linearizer for a class-F GaN HEMT power amplifier using two independently controlled diodes," Asia-Pacific Microwave Conf., 2009, IEEE, pp. 269-272.

Leke, Achankeng et al."Behavioral modeling of narrowband microwave power amplifiers with applications in simulating spectral regrowth," IEEE MTT-S Digest, 1996, pp. 1385-1388.

Yamauchi, K. et al., "Series anti-parallel diode linearizer for class-B power amplifiers with a gain expansion," Asia-Pacific Microwave Conf., 2006, 4 pages.

* cited by examiner

POWER AMPLIFIER LINEARIZATION CIRCUIT AND RELATED APPARATUS

FIELD OF THE DISCLOSURE

The technology of the disclosure relates generally to a power amplifier apparatus.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience depends on higher data rates offered by a newer generation of wireless communication systems, such as the fifth-generation (5G) wireless communication system. To achieve the higher data rates and desirable coverage range, a mobile communication device typically employs a power amplifier(s) to increase output power of a wireless communication signal to maintain sufficient energy per bit and/or desirable signal-to-noise ratio (SNR).

Notably, the wireless communication signal communicated in the 5G wireless communication system can correspond to a non-constant amplitude envelope and exhibit higher peak-to-average ratio (PAR), which can drive the power amplifier(s) into compression. As a result, the power amplifier(s) can suffer a linearity response deviation that can lead to undesirable out-of-band spectral regrowth and in-band distortion. As such, it may be desirable to reduce the linearity response deviation to help reduce out-of-band spectral regrowth and in-band distortion of the power amplifier(s).

SUMMARY

Embodiments of the disclosure relate to a power amplifier linearization circuit and related apparatus. In examples disclosed herein, the power amplifier linearization circuit includes an analog pre-distortion (APD) circuit coupled to an input of a power amplifier. Notably, the power amplifier can exhibit linearity response deviation, namely linearity amplitude response deviation and linearity phase response deviation, when amplifying a radio frequency (RF) signal under a compression condition. As such, the APD circuit is configured to receive a control signal corresponding to the linearity response deviation and pre-process the RF signal based on the control signal before providing the RF signal to the power amplifier. As a result, it may be possible to reduce the linearity response deviation in the power amplifier, thus helping to improve linearity and RF performance of the power amplifier.

In one aspect, a power amplifier linearization circuit is provided. The power amplifier linearization circuit includes a signal input that receives an RF signal. The power amplifier linearization circuit also includes a signal output that outputs the RF signal to a power amplifier configured to amplify the RF signal to generate an amplified RF signal. The power amplifier linearization circuit also includes an APD circuit coupled between the signal input and the signal output. The APD circuit is configured to receive a control signal corresponding to a linearity response deviation of the power amplifier. The APD circuit is also configured to process the RF signal based on the control signal to reduce the linearity response deviation.

In another aspect, a power amplifier apparatus is provided. The power amplifier apparatus includes a power amplifier configured to amplify an RF signal to generate an amplified RF signal. The power amplifier apparatus also includes a power amplifier linearization circuit. The power amplifier linearization circuit includes a signal input that receives the RF signal. The power amplifier linearization circuit also includes a signal output that outputs the RF signal to the power amplifier. The power amplifier linearization circuit also includes an APD circuit coupled between the signal input and the signal output. The APD circuit is configured to receive a control signal corresponding to a linearity response deviation of the power amplifier. The APD circuit is also configured to process the RF signal based on the control signal to reduce the linearity response deviation.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power amplifier linearization circuit and related apparatus. In examples disclosed herein, the power amplifier linearization circuit includes an analog pre-distortion (APD) circuit coupled to an input of a power amplifier. Notably, the power amplifier can exhibit linearity response deviation, namely linearity amplitude response deviation and linearity phase response deviation, when amplifying a radio frequency (RF) signal under a compression condition. As such, the APD circuit is configured to receive a control signal corresponding to the linearity response deviation and pre-process the RF signal based on the control signal before providing the RF signal to the power amplifier. As a result, it may be possible to reduce the linearity response deviation in the power amplifier, thus helping to improve linearity and RF performance of the power amplifier.

Before discussing the power amplifier linearization circuit of the present disclosure, a brief overview of an exemplary power amplifier is first provided with reference to FIGS. 1A-1G to help explain certain key characteristics and operational principles of the power amplifier. The discussion of specific exemplary aspects of a power amplifier linearization circuit configured according to the present disclosure starts next with reference to FIG. 2A.

Figure 1A:
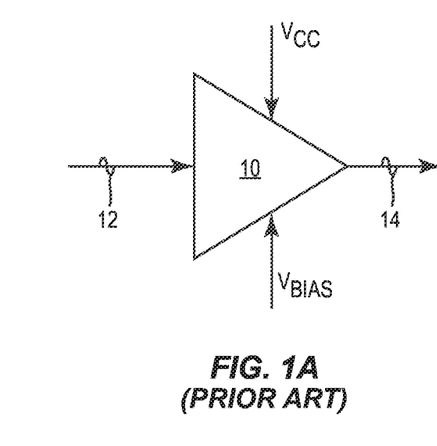
FIG. 1A is a schematic diagram of an exemplary power amplifier.

FIG. 1A is a schematic diagram of an exemplary power amplifier 10. The power amplifier 10 is configured to amplify an RF signal 12 based on a bias voltage $V_{BIAS}$ and a supply voltage $V_{CC}$ to generate an amplified RF signal 14 having a higher power than the RF signal 12.

Figure 1B:
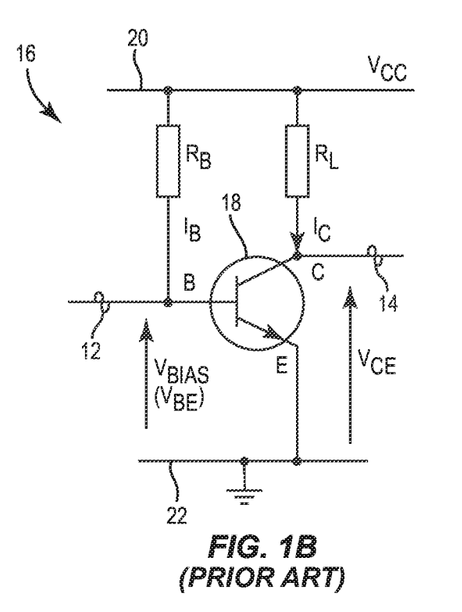
FIG. 1B is a schematic diagram providing an exemplary illustration of an output stage of the power amplifier of FIG. 1A.

The power amplifier 10 can include a single stage (e.g., an output stage) or multiple stages (e.g., a driver stage and an output stage). In this regard, FIG. 1B is a schematic diagram providing an exemplary illustration of an output stage 16 in the power amplifier 10 of FIG. 1A. Common elements between FIGS. 1A and 1B are shown therein with common element numbers and will not be re-described herein.

In a non-limiting example, the output stage 16 includes a transistor 18, such as a bipolar junction transistor (BJT), having a base electrode B, a collector electrode C, and an emitter electrode E. Notably, the transistor 18 may also be a field-effect transistor (FET). Accordingly, the base electrode B, the collector electrode C, and the emitter electrode E may also be referred to as a gate electrode, a drain electrode, and a source electrode, respectively. The base electrode B may be coupled to a supply rail 20 via a bias resistor $R_B$. The collector terminal C may be coupled to the supply rail 20 via a load resistor $R_L$. The emitter terminal E may be coupled to a ground rail 22.

The transistor 18 receives the bias voltage $V_{BIAS}$ between the base terminal B and the emitter terminal E. In this regard, the bias voltage $V_{BIAS}$ is equivalent to a base-emitter voltage $V_{BE}$. The supply voltage $V_{CC}$ is applied between the supply rail 20 and the ground rail 22. As such, the supply voltage $V_{CC}$ is equivalent to a collector-emitter voltage $V_{CE}$.

The transistor 18 is in an active state when the base-emitter voltage $V_{BE}$ is greater than zero and less than the collector-emitter voltage $V_{CE}$ ($V_{CE}>V_{BE}>0$). When the transistor 18 is in the active state, a collector-emitter current $I_C$ is proportional to a base current $I_B$. In this regard, the transistor 18 is in a linear state, thus causing the power amplifier 10 to operate as a linear device.

The transistor 18 is in a saturation state when the base-emitter voltage $V_{BE}$ is greater than the collector-emitter voltage $V_{CE}$ ($V_{BE}>V_{CE}$). When the transistor 18 is in the saturation state, the transistor 18 acts like a short circuit, thus allowing the collector-emitter current $I_C$ to flow freely from the collector terminal C to the emitter terminal E. In this regard, the power amplifier 10 produces a maximum collector-emitter current $I_C$.

The transistor 18 is in a cut-off state when the collector-emitter voltage $V_{CE}$ is greater than the base-emitter voltage $V_{BE}$ ($V_{BE}<V_{CE}$). When the transistor 18 is in the cut-off state, the transistor 18 acts like an open circuit, thus preventing the collector-emitter current $I_C$ from flowing from the collector terminal C to the emitter terminal E. In this regard, the collector-emitter current $I_C$ is at a minimum level.

Figure 1C:
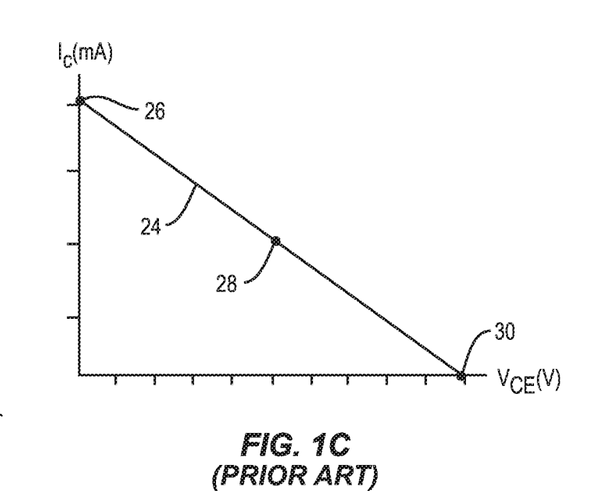
FIG. 1C is a graphic diagram providing an exemplary illustration of a load line corresponding to the power amplifier of FIG. 1A.

The active state, the saturation state, and the cut-off state of the power amplifier 10 can be visualized using a load line plot. In this regard, FIG. 1C is a graphic diagram providing an exemplary illustration of a load line 24 corresponding to the power amplifier 10 of FIG. 1A. As discussed below, the power amplifier 10 can be configured to operate in different states by moving a bias point (also known as quiescent point or Q-point) of the power amplifier 10 along the load line 24. The power amplifier 10 operates in the saturation state when the Q-point of the power amplifier 10 is set at a saturation point 26.

The power amplifier 10 operates in the linear state when the Q-point of the power amplifier 10 is set at a middle point 28 of the load line 24. Accordingly, the power amplifier 10 can be said to operate in a class-A mode or referred to as a class-A power amplifier.

The power amplifier 10 operates in the cut-off state when the Q-point of the power amplifier 10 is set at a cut-off point 30. Accordingly, the power amplifier 10 can be said to operate in a class-B mode or referred to as a class-B power amplifier.

Notably, when the Q-point of the power amplifier 10 is set between the middle point 28 and the cut-off point 30 on the load line 24, the power amplifier 10 can be said to operate in a class-AB mode or referred to as a class-AB power amplifier.

Figure 1D:
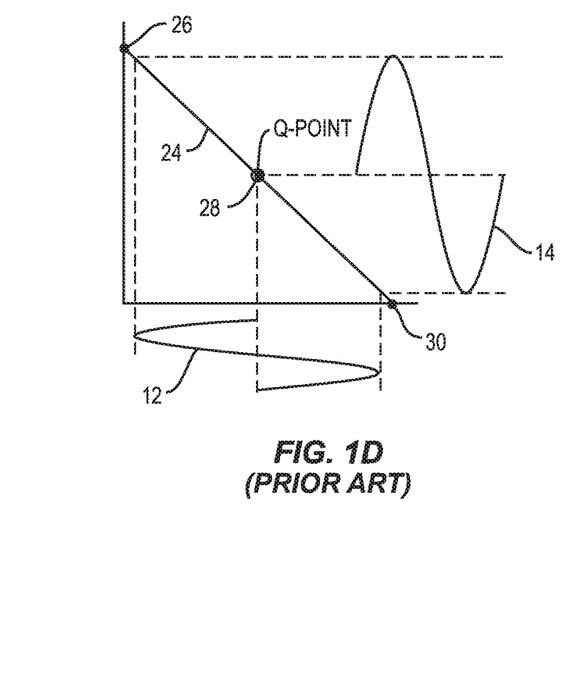
FIG. 1D is a graphic diagram providing an exemplary illustration of characteristics of the power amplifier of FIG. 1A when operating as a class-A power amplifier.

FIG. 1D is a graphic diagram providing an exemplary illustration of characteristics of the power amplifier 10 of FIG. 1A when operating as a class-A power amplifier. Common elements between FIGS. 1C and 1D are shown therein with common element numbers and will not be re-described herein.

When the power amplifier 10 is operating in the class-A mode, the Q-point of the power amplifier 10 is set at the middle point 28 along the load line 24. In this regard, the power amplifier 10 operates as a linear device and the amplified RF signal 14 in FIG. 1A is linearly proportional to the RF signal 12 in FIG. 1A. Given that the power amplifier 10 never drives the amplified RF signal 14 beyond the saturation point 26 and the cut-off point 30, the amplified RF signal 14 will not be compressed or clipped. As such, the power amplifier 10 can effectively suppress out-of-band spectral regrowth and/or in-band interference. As a result, the power amplifier 10 can operate with desirable adjacent channel power ratio (ACPR) and error vector magnitude (EVM). Notably, the improved linearity performance comes at the expense of reduced power amplifier efficiency (PAE). The PAE of the power amplifier 10 is typically below 25% in the class-A mode.

In contrast, the power amplifier 10 can achieve an enhanced possible PAE when operating in the class-B mode. However, in the class-B mode, the power amplifier 10 will no longer operate as a linear device. As a result, the power amplifier 10 can suffer a significant degradation in ACPR and EVM. In this regard, the class-AB mode is often seen as a trade-off configuration between the class-A mode and the class-B mode.

Figure 1E:
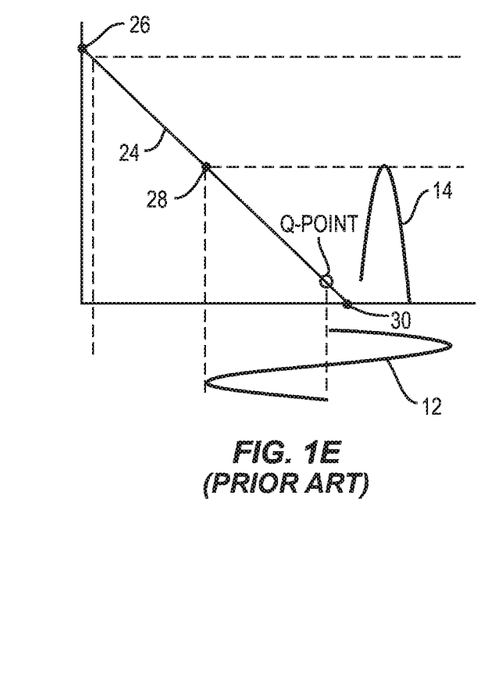
FIG. 1E is a graphic diagram providing an exemplary illustration of characteristics of the power amplifier of FIG. 1A when operating as a class-AB power amplifier under a compression condition.

FIG. 1E is a graphic diagram providing an exemplary illustration of characteristics of the power amplifier 10 of FIG. 1A when operating as a class-AB power amplifier. Common elements between FIGS. 1C and 1E are shown therein with common element numbers and will not be re-described herein.

In the class-AB mode, the Q-point of the power amplifier 10 is set between the middle point 28 and the cut-off point 30 along the load line 24. In this regard, the power amplifier 10 will neither offer the linearity performance of the class-A mode nor achieve the PAE of the class-B mode. As shown in FIG. 1E, the amplified RF signal 14 is no longer a replica of the RF signal 12 due to amplitude clipping. As such, the power amplifier 10 is said to be under a compression condition when operating in the class-AB mode.

When operating under the compression condition, the power amplifier 10 can exhibit linearity amplitude response deviation and linearity phase response deviation. In this regard, FIGS. 1F and 1G are graphic diagrams providing exemplary illustrations of the linearity amplitude response deviation and the linearity phase response deviation that may result from the power amplifier 10 of FIG. 1A operating under the compression condition of FIG. 1E.

Figure 1F:
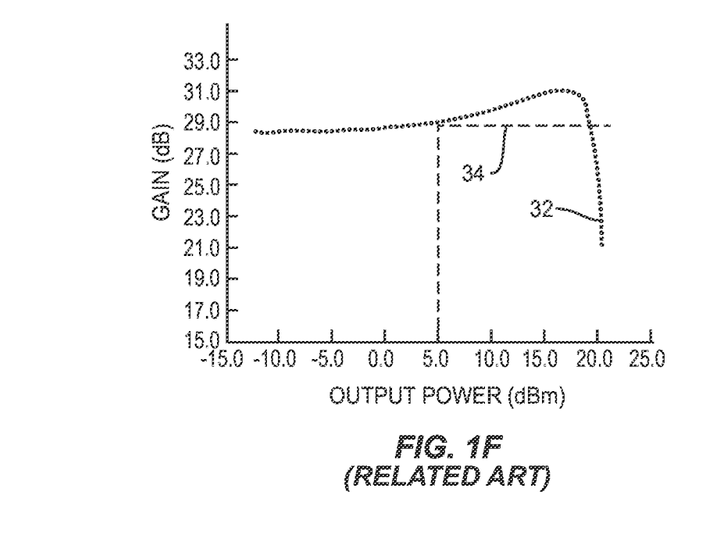
FIGS. 1F and 1G are graphic diagrams providing exemplary illustrations of linearity amplitude response deviation and linearity phase response deviation that may result from the power amplifier of FIG. 1A operating under the compression condition of FIG. 1E.

FIG. 1F illustrates a linearity amplitude response curve 32. In a non-limiting example, the linearity amplitude response curve 32 exhibits a positive linearity response deviation from an ideal flat amplitude response curve 34 when the amplified RF signal 14 in FIG. 1A is above a certain output power threshold (e.g., 5 dBm). For example, when the output power is above 5 dBm, the linearity amplitude response curve 32 can have a 0.7 dB amplitude response deviation from the ideal flat amplitude response curve 34.

Figure 1G:
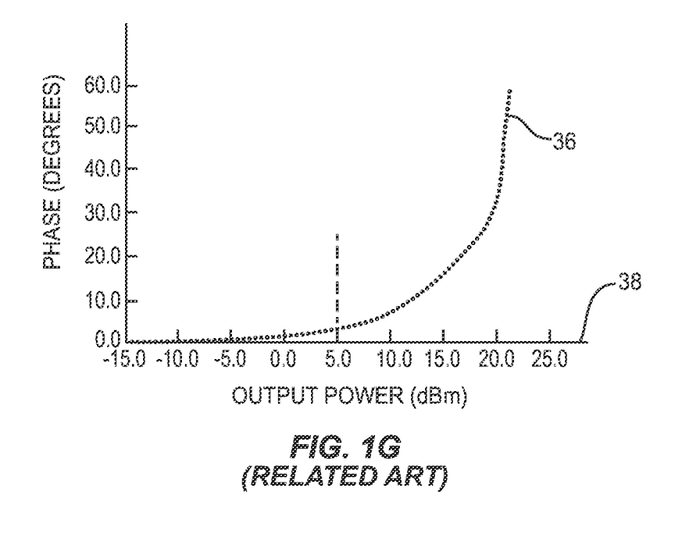

FIG. 1G illustrates a linearity phase response curve 36. Similar to the linearity amplitude response curve 32 in FIG. 1F, the linearity phase response curve 36 exhibits a positive linearity phase deviation from an ideal flat phase response curve 38 when the amplified RF signal 14 in FIG. 1A is above a certain power threshold (e.g., 5 dBm). For example, when the output power is above 5 dBm, the linearity phase response curve 36 can have a 12° phase response deviation from the ideal flat phase response curve 38.

As discussed above, the class-AB mode of operation represents a trade-off between linearity and RF performance of the power amplifier 10 of FIG. 1A. However, when the power amplifier 10 operates in the class-AB mode under the compression condition, the power amplifier 10 may experience the linearity amplitude response deviation and the linearity phase response deviation as shown in FIGS. 1F and 1G. Given that the linearity amplitude response deviation and the linearity phase response deviation can contribute to potential EVM degradation, it may be desirable to reduce the linearity amplitude response deviation and the linearity phase response deviation to help improve linearity and RF performance of the power amplifier 10.

Figure 2A:
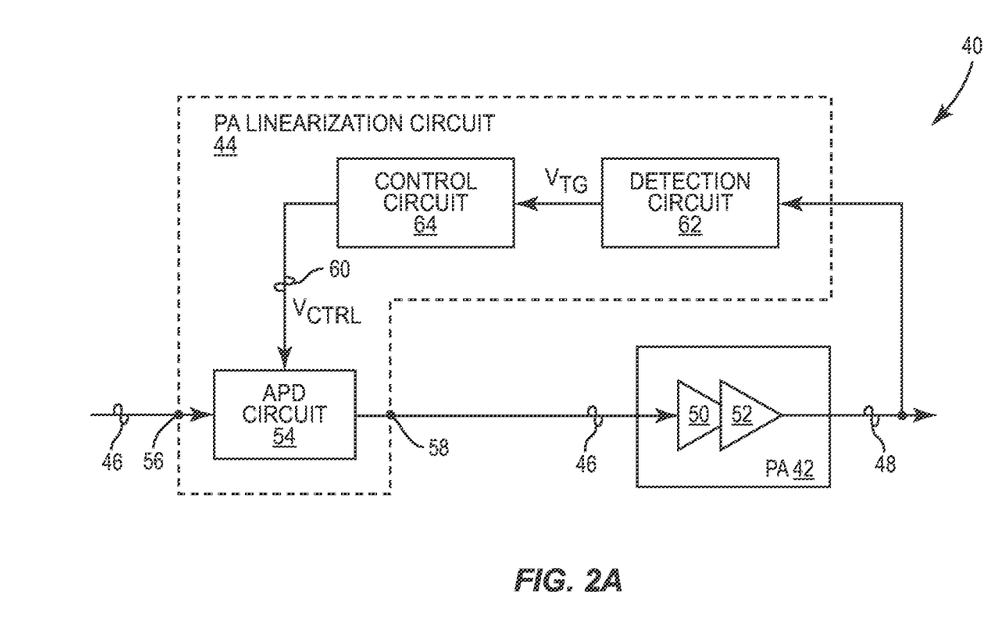
FIG. 2A is a schematic diagram of an exemplary power amplifier apparatus including a power amplifier and a power amplifier linearization circuit configured to reduce linearity response deviation of the power amplifier.

In this regard, FIG. 2A is a schematic diagram of an exemplary power amplifier apparatus 40 including a power amplifier 42 and a power amplifier linearization circuit 44 configured to reduce a linearity response deviation of the power amplifier 42. The power amplifier 42 is configured to amplify an RF signal 46 to generate an amplified RF signal 48. In a non-limiting example, the power amplifier 42 is a multi-stage power amplifier including a driver stage 50 configured to receive the RF signal 46 and an output stage 52 configured to output the amplified RF signal 48. It should be appreciated that the power amplifier linearization circuit 44 can also effectively reduce the linearity response deviation when the power amplifier 42 is a single-stage power amplifier.

Notably, the power amplifier 42 may experience the linearity response deviation as previously discussed in FIGS. 1F and 1G. In this regard, the power amplifier linearization circuit 44 is configured to include an APD circuit 54 to help reduce the linearity response deviation of the power amplifier 42. More specifically, the APD circuit 54 is configured to reduce a positive amplitude response deviation between the linearity amplitude response curve 32 and the ideal flat phase response curve 38 in FIG. 1F as well as a positive phase response deviation between the linearity phase response curve 36 and the ideal flat phase response curve 38 in FIG. 1G.

The power amplifier linearization circuit 44 can be configured to include a signal input 56 and a signal output 58. The signal input 56 may be coupled to a transceiver circuit (not shown) to receive the RF signal 46. The signal output 58 may be coupled to the driver stage 50 to output the RF signal 46 to the power amplifier 42. In a non-limiting example, the APD circuit 54 is provided in front of the driver stage 50 of the power amplifier 42 and between the signal input 56 and the signal output 58. As discussed in detail below, the APD circuit 54 is configured to receive a control signal 60, which can include a control voltage $V_{CTRL}$ that is quantitatively related to the linearity response deviation of the power amplifier 42. Accordingly, the APD circuit 54 is configured to process the RF signal 46 based on the control voltage $V_{CTRL}$ to cause the linearity response deviation to be reduced at the output stage 52 of the power amplifier 42.

Moreover, studies have shown that the APD circuit 54 is able to respond to the linearity response deviation in a timely fashion (e.g., <1 μs) and can handle a wider modulation bandwidth (e.g., up to 1 GHz). By providing the APD circuit 54 in front of the power amplifier 42 to pre-process the RF signal 46 prior to amplification, it may be possible to respond to the linearity response deviation in a timely manner, thus helping to improve linearity and EVM of the power amplifier 42.

The power amplifier linearization circuit 44 can be configured to include a detection circuit 62 and a control circuit 64. The detection circuit 62 is coupled to the output stage 52 of the power amplifier 42. The control circuit 64 is coupled between the detection circuit 62 and the APD circuit 54. The detection circuit 62 is configured to detect the linearity response deviation at the output stage 52 of the power amplifier 42 and generate a trigger voltage $V_{TG}$ in response to detecting the linearity response deviation. The control circuit 64 is configured to receive the trigger voltage $V_{TG}$ from the detection circuit 62. Accordingly, the control circuit 64 generates the control voltage $V_{CTRL}$ to cause the APD circuit 54 to respond to the linearity response deviation detected by the detection circuit 62.

Figure 2B:
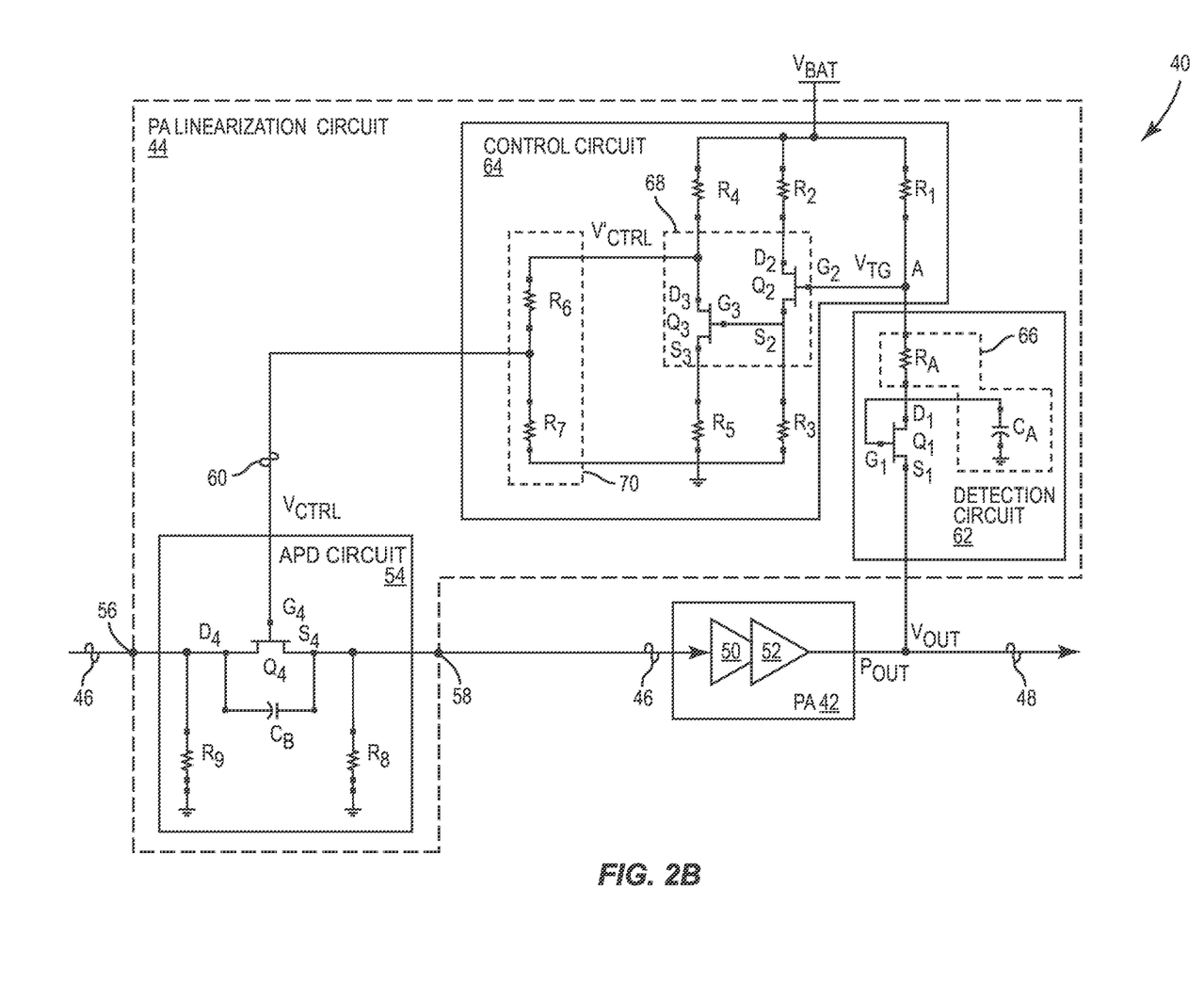
FIG. 2B is a schematic diagram providing an exemplary detailed illustration of the power amplifier apparatus of FIG. 2A.

FIG. 2B is a schematic diagram providing an exemplary detailed illustration of the power amplifier apparatus 40 of FIG. 2A. Common elements between FIGS. 2A and 2B are shown therein with common element numbers and will not be re-described herein.

In a non-limiting example, the detection circuit 62 includes a capacitor $C_A$, a transistor-based diode $Q_1$, and a resistor $R_A$. The transistor-based diode $Q_1$ and the resistor $R_A$ are coupled in series between the output stage 52 and a coupling node A. Specifically, the transistor-based diode $Q_1$ includes a source electrode $S_1$ coupled to the output stage 52 of the power amplifier 42, a drain electrode $D_1$ coupled to the resistor $R_A$, and a gate electrode $G_1$ coupled to the drain electrode $D_1$. The capacitor $C_A$ is coupled in parallel to the transistor-based diode $Q_1$. The capacitor $C_A$ and the resistor $R_A$ collectively form a resistor-capacitor (RC) circuit 66.

In the same non-limiting example, the control circuit 64 includes resistors $R_1$, $R_2$, $R_3$, $R_4$, $R_5$, $R_6$, and $R_7$ as well as transistors $Q_2$ and $Q_3$. The resistor $R_1$ is coupled between the coupling node A and a battery voltage $V_{BAT}$. The transistor $Q_2$ has a gate electrode $G_2$ coupled to the coupling node A, a drain electrode $D_2$ coupled to the battery voltage $V_{BAT}$ via the resistor $R_2$, and a source electrode $S_2$ coupled to a ground via the resistor $R_3$. The transistor $Q_3$ has a gate electrode $G_3$ coupled to the source electrode $S_2$ of the transistor $Q_2$, a drain electrode $D_3$ coupled to the battery voltage $V_{BAT}$ via the resistor $R_4$, and a source electrode $S_3$ coupled to the ground via the resistor $R_5$. The transistors $Q_2$ and $Q_3$ collectively form a transistor network 68. The resistors $R_6$ and $R_7$ are coupled in series to form a voltage divider 70 between the drain $D_3$ of the transistor $Q_3$ and the ground.

In the same non-limiting example, the APD circuit includes resistors $R_8$, $R_9$, transistor $Q_4$, and capacitor $C_B$. The transistor $Q_4$ has a gate electrode $G_4$ coupled to the voltage divider 70, a drain electrode $D_4$ coupled to the signal input 56, and a source electrode $S_4$ coupled to the signal output 58. The capacitor $C_B$ is coupled in parallel to the transistor $Q_4$ between the signal input 56 and the signal output 58. The resistor $R_8$ is coupled between the source electrode $S_4$ and the ground. The resistor $R_9$ is coupled between the drain electrode $D_4$ and the ground.

When the linearity response deviation occurs at the output stage 52 of the power amplifier 42, an output voltage $V_{OUT}$ at the output stage 52 moves progressively lower as an output power $P_{OUT}$ at the output stage 52 increases. The decreasing output voltage $V_{OUT}$ causes the transistor-based diode $Q_1$ to become conductive to reduce the trigger voltage $V_{TG}$ at the coupling node A. The RC circuit 66 in the detection circuit 62 is configured to set a cut-off frequency (also known as corner frequency) well below a carrier frequency of the amplified RF signal 48. Accordingly, the RC circuit 66 can output the trigger voltage $V_{TG}$ to the transistor network 68 within a defined triggering bandwidth (e.g., up to 1 GHz) that corresponds to a modulation bandwidth of the power amplifier 42.

The decreased trigger voltage $V_{TG}$, in turn, causes the transistors $Q_2$ and $Q_3$ in the transistor network 68 to be turned on. Notably, the transistor $Q_2$ is included in the transistor network 68 to prevent the transistor $Q_3$ from being prematurely turned on. When the transistors $Q_2$ and $Q_3$ are turned on, the transistor network 68 generates an initial control voltage $V'_{CTRL}$ across the voltage divider 70. The voltage divider 70 may be configured to divide the initial control voltage $V'_{CTRL}$ to generate the control voltage $V_{CTRL}$.

Figure 3:
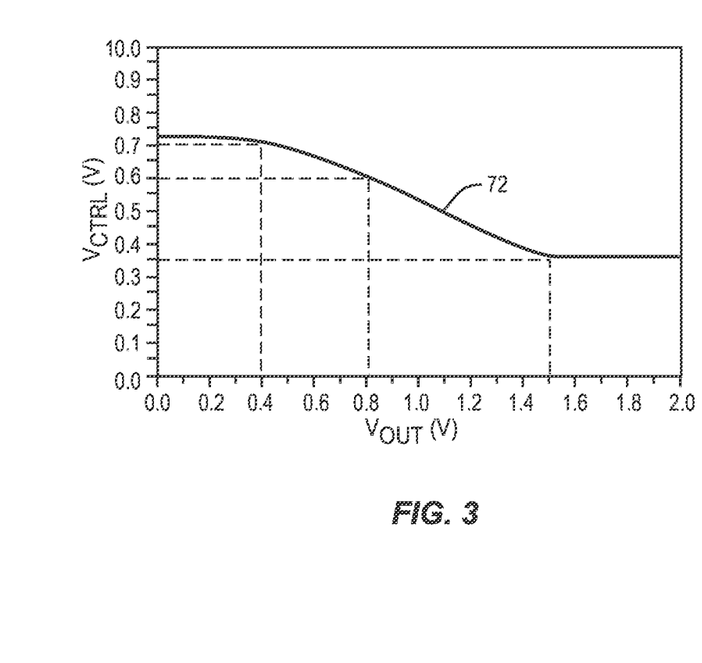
FIG. 3 is a graphic diagram providing an exemplary illustration of a quantitative relation between a control voltage generated by the power amplifier linearization and an output voltage at the output stage of the power amplifier in the power amplifier apparatus of FIGS. 2A and 2B.

The control circuit 64 can be configured to generate the control voltage $V_{CTRL}$ that is quantitatively related to the output voltage $V_{OUT}$ at the output stage 52 of the power amplifier 42. In this regard, FIG. 3 is a graphic diagram providing an exemplary illustration of a quantitative relation between the control voltage $V_{CTRL}$ and the output voltage $V_{OUT}$ at the output stage 52 of the power amplifier 42 in the power amplifier apparatus 40 of FIGS. 2A and 2B.

The quantitative relation between the control voltage $V_{CTRL}$ and the output voltage $V_{OUT}$ can be set based on a voltage correlation curve 72. For example, the control voltage $V_{CTRL}$ can be generated at approximately 0.7 V, 0.6 V, and 0.35 V, respectively, when the output voltage $V_{OUT}$ is approximately at 0.4 V, 0.8 V, and 1.5 V.

With reference back to FIG. 2B, the transistor $Q_4$ in the APD circuit 54 is controlled by the control voltage $V_{CTRL}$ that is quantitatively related to the output voltage $V_{OUT}$. As a result, the transistor $Q_4$ can effectively adjust the RF signal 46 to help reduce the linearity response deviation at the output stage 52 of the power amplifier 42. Notably, the transistor Q4 can have approximately 10Ω of on-resistance for 100 micrometer (μm) of gate periphery. The capacitor $C_B$, on the other hand, can be configured to have approximately 40Ω of reactance. Due to the higher impedance of the capacitor $C_B$, it may be possible to reduce the size of the transistor $Q_4$, thus helping to reduce insertion loss of the APD circuit 54. Although the transistor-based diode $Q_1$ and the transistors $Q_2$, $Q_3$, and $Q_4$ are shown herein as FETs, it should be appreciated that the transistor-based diode $Q_1$ and the transistors $Q_2$, $Q_3$, and $Q_4$ can also be BJTs.

Figure 4A:
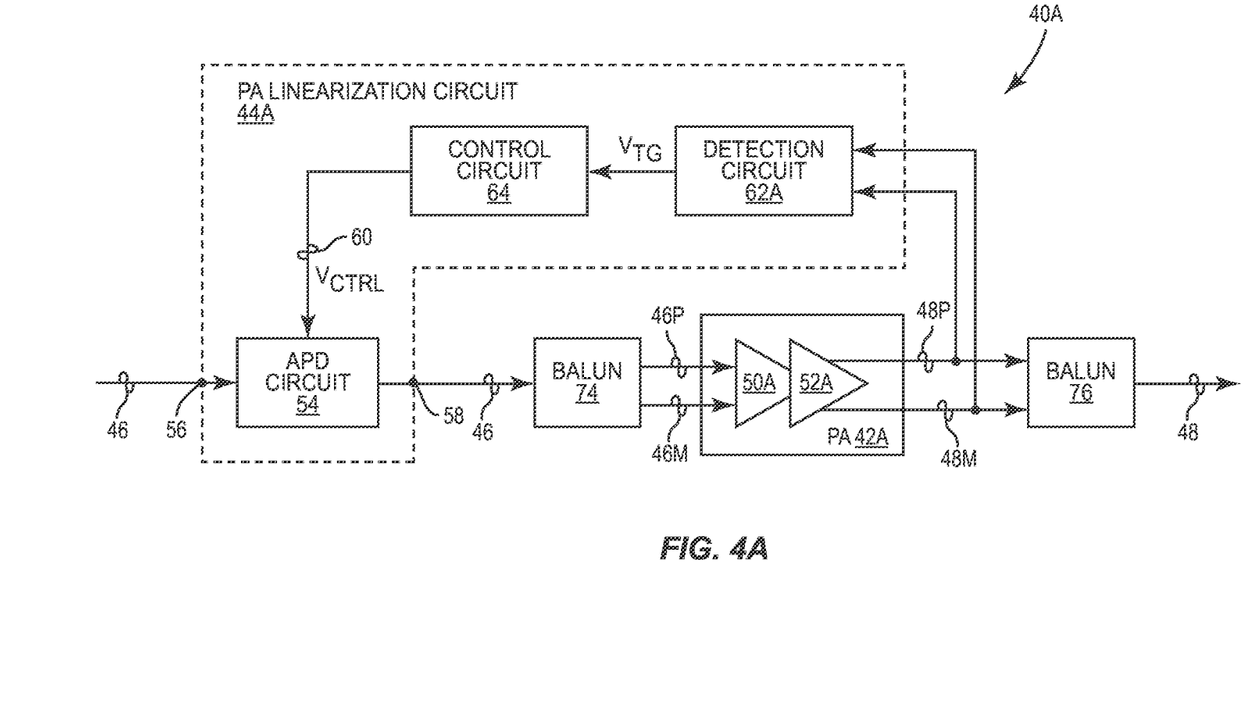
FIG. 4A is a schematic diagram of an exemplary power amplifier apparatus configured according to another embodiment of the present disclosure.

The power amplifier 42 can also be configured to operate as a differential power amplifier to amplify the RF signal 46, as discussed next in FIGS. 4A and 4B. In this regard, FIG. 4A is a schematic diagram of an exemplary power amplifier apparatus 40A configured according to another embodiment of the present disclosure. Common elements between FIGS. 2A and 4A are shown therein with common element numbers and will not be re-described herein.

The power amplifier apparatus 40A includes a power amplifier 42A and a power amplifier linearization circuit 44A. The power amplifier 42A is a differential power amplifier that includes an input stage 50A and an output stage 52A. It should be appreciated that the power amplifier linearization circuit 44A can also effectively reduce the linearity response deviation when the power amplifier 42A is a single-stage power amplifier. In this regard, the power amplifier apparatus 40A further includes an input balun 74 coupled between the APD circuit 54 and the input stage 50A. The input balun 74 is configured to convert the RF signal 46 into a plus RF signal 46P and a minus RF signal 46M. The power amplifier 42A amplifies the plus RF signal 46P and the minus RF signal 46M to generate an amplified plus RF signal 48P and an amplified minus RF signal 48M. The power amplifier apparatus 40A further includes an output balun 76 coupled to the output stage 52A. The output balun 76 is configured to convert the amplified plus RF signal 48P and the amplified minus RF signal 48M into the amplified RF signal 48.

The power amplifier linearization circuit 44A includes a detection circuit 62A coupled to the output stage 52A. The detection circuit 62A is configured to detect the linearity response deviation at the output stage 52A based on the amplified plus RF signal 48P and the amplified minus RF signal 48M. Accordingly, the detection circuit 62A generates the trigger voltage $V_{TG}$ to cause the control circuit 64 to generate the control voltage $V_{CTRL}$.

Figure 4B:
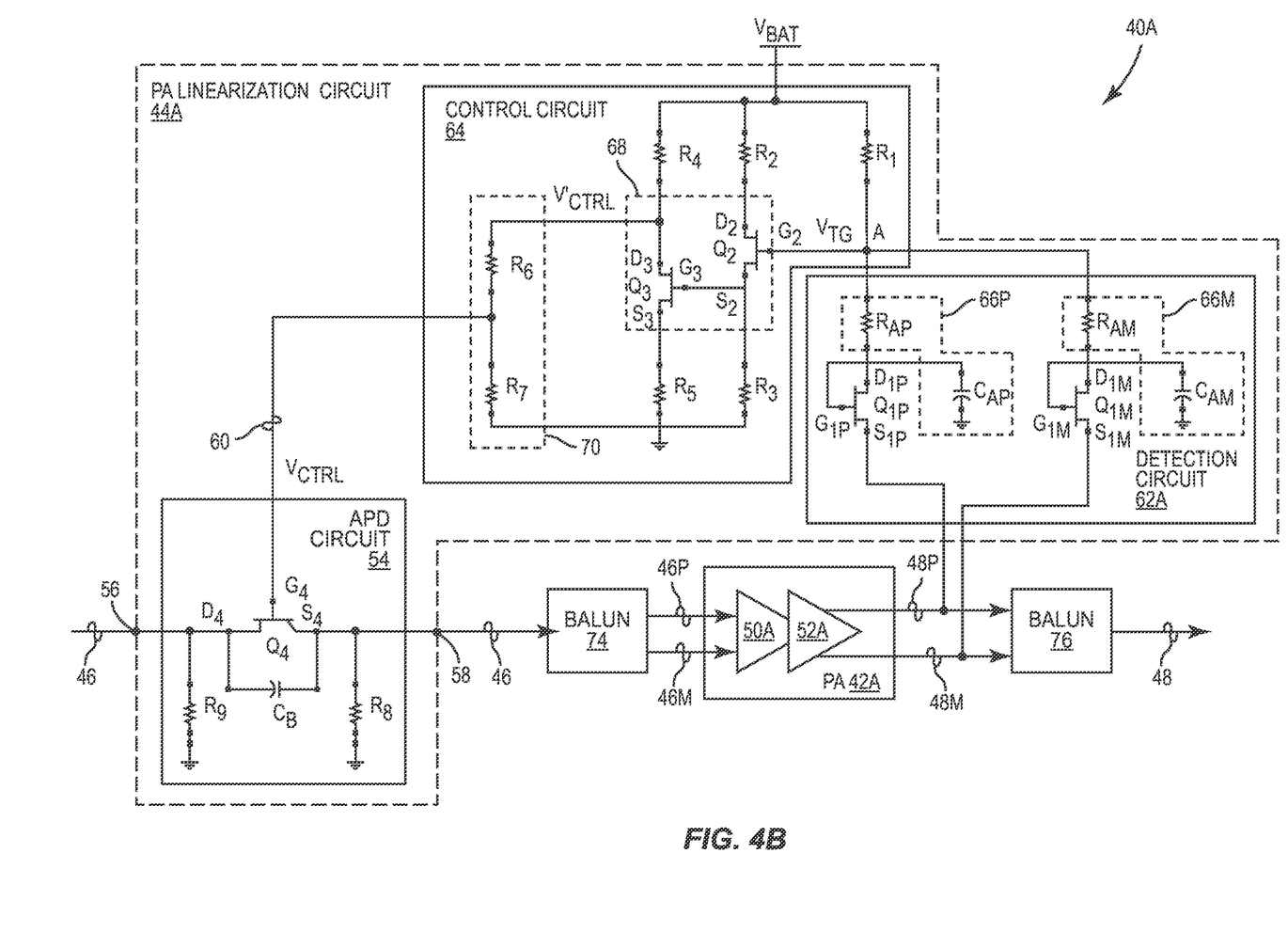
FIG. 4B is a schematic diagram providing an exemplary detailed illustration of the power amplifier apparatus of FIG. 4A.

FIG. 4B is a schematic diagram providing an exemplary detailed illustration of the power amplifier apparatus 40A of FIG. 4A. Common elements between FIGS. 2A, 2B, 4A, and 4B are shown therein with common element numbers and will not be re-described herein.

In a non-limiting example, the detection circuit 62A includes a plus capacitor $C_{AP}$, a minus capacitor $C_{AM}$, a transistor-based plus diode $Q_{1P}$, a transistor-based minus diode $Q_{1M}$, a plus resistor $R_{AP}$, and a minus resistor $R_{AM}$. The transistor-based plus diode $Q_{1P}$ and the plus resistor $R_{AP}$ are coupled in series between the output stage 52A and a coupling node A. Specifically, the transistor-based plus diode $Q_{1P}$ includes a source electrode $S_{1P}$ coupled to the output stage 52A of the power amplifier 42A, a drain electrode $D_{1P}$ coupled to the plus resistor $R_{AP}$, and a gate electrode $G_{1P}$ coupled to the drain electrode $D_{1P}$. The plus capacitor $C_{AP}$ is coupled in parallel to the transistor-based plus diode $Q_{1P}$. The plus capacitor $C_{AP}$ and the plus resistor $R_{AP}$ collectively form a plus RC circuit 66P.

Similarly, the transistor-based minus diode $Q_{1M}$ and the minus resistor $R_{AM}$ are coupled in series between the output stage 52 and a coupling node A. Specifically, the transistor-based minus diode $Q_{1M}$ includes a source electrode $S_{1M}$ coupled to the output stage 52A of the power amplifier 42A, a drain electrode $D_{1M}$ coupled to the minus resistor $R_{AM}$, and a gate electrode $G_{1M}$ coupled to the drain electrode $D_{1M}$. The minus capacitor $C_{AM}$ is coupled in parallel to the transistor-based minus diode $Q_{1M}$. The minus capacitor $C_{AM}$ and the minus resistor $R_{AM}$ collectively form a minus RC circuit 66M. Although the transistor-based plus diode $Q_{1P}$ and the transistor-based minus diode $Q_{1M}$ are shown herein as FETs, it should be appreciated that the transistor-based plus diode $Q_{1P}$ and the transistor-based minus diode $Q_{1M}$ can also be BJTs.

Figure 5:
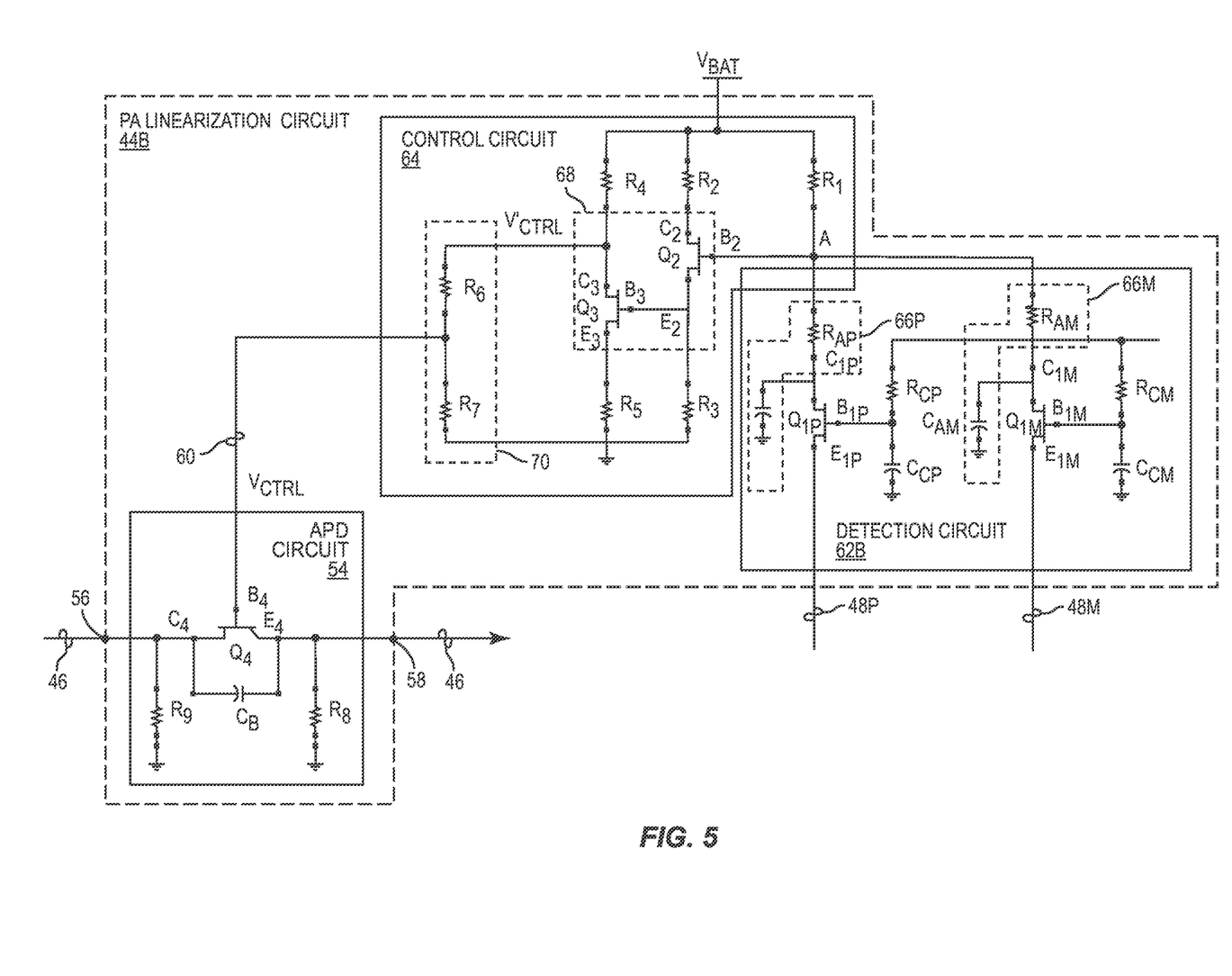
FIG. 5 is a schematic diagram of an exemplary power amplifier linearization circuit configured according to another embodiment of the present disclosure.

The power amplifier linearization circuit 44 of FIG. 2B and the power amplifier linearization circuit 44A of FIG. 4B can be further configured to adjust the trigger voltage $V_{TG}$ in a controllable fashion. In this regard, FIG. 5 is a schematic diagram of an exemplary power amplifier linearization circuit 44B configured according to another embodiment of the present disclosure. Common elements between FIGS. 2B, 4B, and 5 are shown therein with common element numbers and will not be re-described herein.

The power amplifier linearization circuit 44B includes a detection circuit 62B, which further includes resistors $R_{CP}$, $R_{CM}$ and capacitors $C_{CP}$, $C_{CM}$ configured as illustrated in FIG. 5. The detection circuit 62B may be configured to adjust the trigger voltage $V_{TG}$ prior to providing the trigger voltage $V_{TG}$ to the control circuit 64.

The power amplifier linearization circuit 44 of FIG. 2A, the power amplifier linearization circuit 44A of FIG. 4A, and the power amplifier linearization circuit 44B of FIG. 5 can effectively reduce the linearity response deviation to improve linearity and EVM of the power amplifier 42 of FIG. 2A and the power amplifier 42A of FIG. 4A. In this regard, FIGS. 6A-6D are graphic diagrams providing exemplary illustrations of linearity and EVM improvements that may be achieved by the power amplifier linearization circuit 44 of FIG. 2A, the power amplifier linearization circuit 44A of FIG. 4A, and the power amplifier linearization circuit 44B of FIG. 5.

Figure 6A:
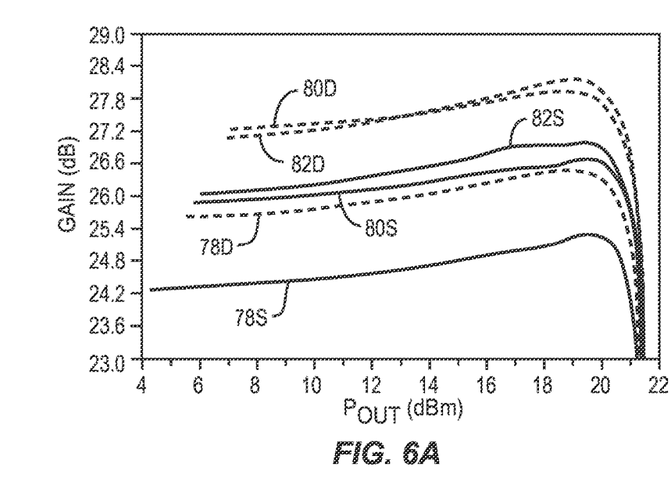
FIGS. 6A-6D are graphic diagrams providing exemplary illustrations of linearity and error vector magnitude (EVM) improvements that may be achieved by the power amplifier linearization circuits of FIGS. 2A, 4A, and 5.

FIG. 6A includes a number of dotted line curves 78D, 80D, and 82D indicative of the amplitude response deviations at different frequencies without analog pre-distortion, and a number of solid line curves 78S, 80S, and 82S indicative of respective amplitude response deviations with analog pre-distortion. For example, the solid line curve 78S indicates a substantial improvement in the amplitude response deviation compared to the respective dotted line curve 78D.

Figure 6B:
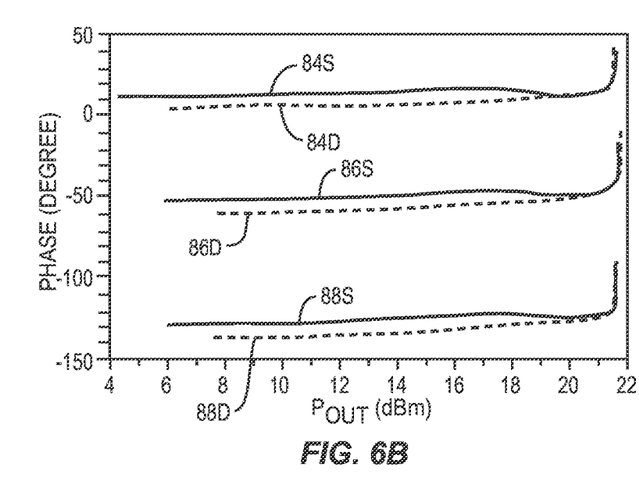

FIG. 6B includes a number of dotted line curves 84D, 86D, and 88D indicative of the phase response deviations at different frequencies without analog pre-distortion, and a number of solid line curves 84S, 86S, and 88S indicative of respective phase response deviations with analog pre-distortion. For example, the solid line curve 84S indicates substantial improvement in the phase response deviation compare to the respective dotted line curve 84D.

Figure 6C:
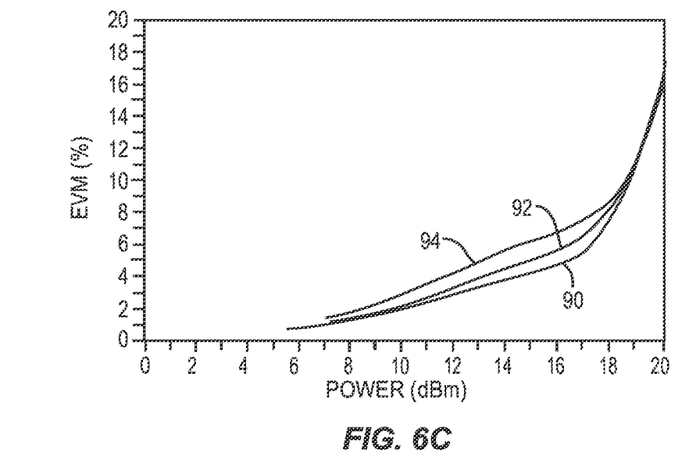
Figure 6D:
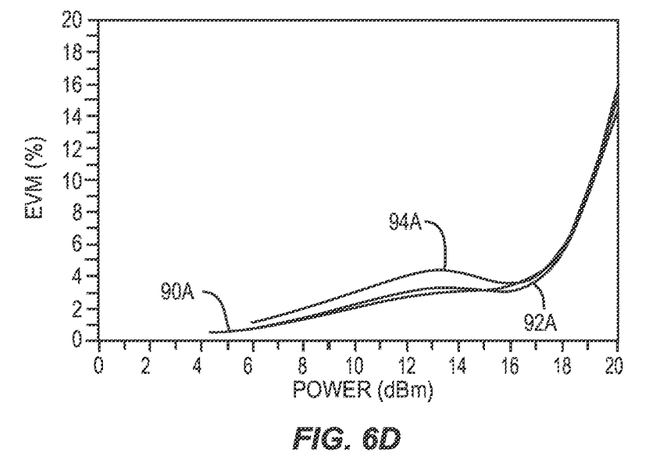

FIG. 6C includes a number of curves 90, 92, and 94 indicative of the EVMs at different frequencies without analog pre-distortion. FIG. 6D includes a number of curves 90A, 92A, and 94A indicative of respective EVMs without analog pre-distortion. For example, the curve 90A indicates substantial EVM reduction compare to the corresponding curve 90.

Those skilled in the art will recognize improvements and modifications to the embodiments of the present disclosure. All such improvements and modifications are considered within the scope of the concepts disclosed herein and the claims that follow.

What is claimed is:

1. A power amplifier linearization circuit comprising:
   a signal input that receives a radio frequency (RF) signal;
   a signal output that outputs the RF signal to a power amplifier configured to amplify the RF signal to generate an amplified RF signal; and
   an analog pre-distortion (APD) circuit coupled between the signal input and the signal output, the APD circuit configured to:
      receive a control signal corresponding to a linearity response deviation that comprises an amplitude response deviation and a phase response deviation of the power amplifier; and
      process the RF signal based on the control signal to reduce the linearity response deviation.

2. The power amplifier linearization circuit of claim 1 wherein
   the APD circuit is further configured to process the RF signal to reduce the amplitude response deviation and the phase response deviation.

3. The power amplifier linearization circuit of claim 1 wherein:
   the amplitude response deviation comprises a positive amplitude response deviation and the phase response deviation comprises a positive phase response deviation; and
   the APD circuit is further configured to process the RF signal to reduce the positive amplitude response deviation and the positive phase response deviation.

4. The power amplifier linearization circuit of claim 1 further comprising:
   a control circuit coupled to the APD circuit and configured to generate the control signal comprising a control voltage in response to receiving a trigger voltage; and
   a detection circuit coupled between the control circuit and the power amplifier and configured to:
      detect the linearity response deviation of the power amplifier; and
      generate the trigger voltage in response to detecting the linearity response deviation.

5. The power amplifier linearization circuit of claim 4 wherein the detection circuit comprises a transistor-based diode coupled between the control circuit and the power amplifier, the transistor-based diode configured to become conductive in response to the linearity response deviation to generate the trigger voltage.

6. The power amplifier linearization circuit of claim 5 wherein the detection circuit further comprises a resistor-capacitor (RC) circuit coupled between the control circuit and the transistor-based diode, the RC circuit configured to output the trigger voltage within a defined triggering bandwidth.

7. The power amplifier linearization circuit of claim 5 wherein the detection circuit is further configured to adjust the trigger voltage prior to providing the trigger voltage to the control circuit.

8. The power amplifier linearization circuit of claim 4 wherein the control circuit comprises:
   a transistor network coupled to the detection circuit and configured to output an initial control voltage in response to receiving the trigger voltage; and
   a voltage divider coupled between the transistor network and the APD circuit, the voltage divider configured to divide the initial control voltage to generate the control voltage.

9. The power amplifier linearization circuit of claim 4 wherein the APD circuit comprises:
   a transistor coupled between the signal input and the signal output, the transistor comprising a base electrode coupled to the control circuit to receive the control voltage; and
   a capacitor coupled in parallel to the transistor between the signal input and the signal output.

10. A power amplifier apparatus comprising:
   a power amplifier configured to amplify a radio frequency (RF) signal to generate an amplified RF signal; and
   a power amplifier linearization circuit comprising:
      a signal input that receives the RF signal;
      a signal output that outputs the RF signal to the power amplifier; and
      an analog pre-distortion (APD) circuit coupled between the signal input and the signal output, the APD circuit configured to:
         receive a control signal corresponding to a linearity response deviation that comprises an amplitude response deviation and a phase response deviation of the power amplifier; and
         process the RF signal based on the control signal to reduce the linearity response deviation.

11. The power amplifier apparatus of claim 10 wherein the APD circuit is further configured to process the RF signal to reduce the amplitude response deviation and the phase response deviation.

12. The power amplifier apparatus of claim 10 wherein:
   the amplitude response deviation comprises a positive amplitude response deviation and the phase response deviation comprises a positive phase response deviation; and
   the APD circuit is further configured to process the RF signal to reduce the positive amplitude response deviation and the positive phase response deviation.

13. The power amplifier apparatus of claim 10 wherein the power amplifier linearization circuit further comprises:
   a control circuit coupled to the APD circuit and configured to generate the control signal comprising a control voltage in response to receiving a trigger voltage; and
   a detection circuit coupled between the control circuit and the power amplifier and configured to:
      detect the linearity response deviation of the power amplifier; and
      generate the trigger voltage in response to detecting the linearity response deviation.

14. The power amplifier apparatus of claim 13 wherein the detection circuit is coupled between the control circuit and an output stage of the power amplifier.

15. The power amplifier apparatus of claim 14 wherein the detection circuit comprises a transistor-based diode coupled between the control circuit and the output stage of the power amplifier, the transistor-based diode configured to become conductive in response to the linearity response deviation to generate the trigger voltage.

16. The power amplifier apparatus of claim 15 wherein the detection circuit further comprises a resistor-capacitor (RC) circuit coupled between the control circuit and the transistor-based diode, the RC circuit configured to output the trigger voltage within a defined triggering bandwidth.

17. The power amplifier apparatus of claim 13 wherein the detection circuit is further configured to adjust the trigger voltage prior to providing the trigger voltage to the control circuit.

18. The power amplifier apparatus of claim 13 wherein the control circuit comprises:

a transistor network coupled to the detection circuit and configured to output an initial control voltage in response to receiving the trigger voltage; and a voltage divider coupled between the transistor network and the APD circuit, the voltage divider configured to divide the initial control voltage to generate the control voltage.

19. The power amplifier apparatus of claim 18 wherein the transistor network comprises at least two transistors coupled in parallel between the detection circuit and the voltage divider.

20. The power amplifier apparatus of claim 13 wherein the APD circuit comprises:

a transistor coupled between the signal input and the signal output, the transistor comprising a base electrode coupled to the control circuit to receive the control voltage; and a capacitor coupled in parallel to the transistor between the signal input and the signal output.

* * * * *